(12) United States Patent
Kusaka

(10) Patent No.: US 8,552,301 B2
(45) Date of Patent: Oct. 8, 2013

(54) CONTACT EQUIPMENT AND CIRCUIT PACKAGE

(75) Inventor: Takashi Kusaka, Gunma (JP)

(73) Assignee: Advantest Corporation, Tokyo (JP)

( * ) Notice: Subject to any disclaimer, the term of this patent is extended or adjusted under 35 U.S.C. 154(b) by 205 days.

(21) Appl. No.: 12/960,210

(22) Filed: Dec. 3, 2010

(65) Prior Publication Data

US 2011/0168433 A1   Jul. 14, 2011

(30) Foreign Application Priority Data

Jan. 13, 2010  (JP) ................................. 2010-005335

(51) Int. Cl.
 *H05K 1/03* (2006.01)
(52) U.S. Cl.
 USPC ......................................................... 174/255
(58) Field of Classification Search
 USPC .......... 174/255, 250, 254, 257–262, 264, 267
 See application file for complete search history.

(56) References Cited

U.S. PATENT DOCUMENTS

| | | | |
|---|---|---|---|
| 7,651,373 B2 * | 1/2010 | Knaub et al. | 439/607.05 |
| 2003/0102536 A1 | 6/2003 | Barre et al. | |
| 2004/0085149 A1 | 5/2004 | Shimada et al. | |
| 2005/0127520 A1 | 6/2005 | Yashiro | |
| 2006/0065965 A1 | 3/2006 | Ohsaka | |
| 2008/0150169 A1 | 6/2008 | Yashiro | |

FOREIGN PATENT DOCUMENTS

| | | |
|---|---|---|
| JP | 2002-246121 A | 8/2002 |
| JP | 2003-249904 A | 9/2003 |
| JP | 2003-258510 A | 9/2003 |
| JP | 2005-166794 A | 6/2005 |
| JP | 2006-128633 A | 5/2006 |
| JP | 2011-018673 A | 1/2011 |

* cited by examiner

*Primary Examiner* — Jeremy Norris
*Assistant Examiner* — Tremesha S Willis

(57) ABSTRACT

A contact device including a contact array, in which contacts are arranged in a grid, and a plurality of differential wire pairs electrically connected to the contact array, wherein each differential wire pair is connected to a contact pair formed by two adjacent contacts in the contact array, and each contact pair is arranged such that a direction of a straight line connecting the two contacts therein is different from a direction of a straight line connecting the two contacts in a contact pair adjacent thereto.

11 Claims, 6 Drawing Sheets

CONTACT EQUIPMENT AND CIRCUIT PACKAGE

BACKGROUND

1. Technical Field

The present invention relates to a contact device and a circuit package.

2. Related Art

A conventionally known semiconductor apparatus includes a BGA (Ball Grid Array) type of contact, as shown in, for example, Patent Document 1. Since communication devices are becoming capable of higher-speed communication, data communication between semiconductor integrated circuits within a semiconductor apparatus and external devices is mostly achieved by serial communication using differential signals.

Therefore, a BGA semiconductor apparatus can use a high-speed differential signal as the transmission signal. The following is a list of Patent Documents provided as related art.
Patent Document 1: Japanese Patent Application Publication No. 2006-128633
Patent Document 2: Japanese Patent Application Publication No. 2005-166794
Patent Document 3: Japanese Patent Application Publication No. 2003-249904
Patent Document 4: Japanese Patent Application Publication No. 2003-258510
Patent Document 5: Japanese Patent Application Publication No. 2002-246121

If a plurality of differential pins are arranged with high density on a BGA contact, the differential pins can be arranged on the BGA such that there are no gaps in a prescribed direction. For example, a plurality of contact balls arranged in a straight line can be used to form differential pins, by using two contact balls per differential pin beginning at one end.

However, when the distance between adjacent contact balls is short, it is easy for signal cross talk to occur therebetween. If the differential pins are arranged in a straight line, as described above, each contact ball in a differential pin experiences cross talk from other differential pins.

In order to decrease this cross talk, shield pins can be arranged between each pair of differential pins. However, since the arrangement of contact balls in a BGA is determined in advance, including the shield pins decreases the density with which the differential pins can be arranged.

SUMMARY

Therefore, it is an object of an aspect of the innovations herein to provide a contact device and a circuit package, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a contact device including a contact array, in which contacts are arranged in a grid, and a plurality of differential wire pairs electrically connected to the contact array, wherein each differential wire pair is connected to a contact pair formed by two adjacent contacts in the contact array, and each contact pair is arranged such that a direction of a straight line connecting the two contacts therein is different from a direction of a straight line connecting the two contacts in a contact pair adjacent thereto.

According to a second aspect related to the innovations herein, provided is a circuit package in which a circuit substrate formed on a semiconductor substrate is formed integrally with a contact device electrically connected to the circuit substrate, wherein the circuit substrate includes a plurality of differential electrode pairs that receive and transfer differential signals, the contact device includes a contact array that has contacts arranged in a grid and that is electrically connected to the differential electrode pairs, each differential electrode pair is connected to a contact pair formed by two adjacent contacts in the contact array, and each contact pair is arranged such that a direction of a straight line connecting the two contacts therein is different from a direction of a straight line connecting the two contacts in a contact pair adjacent thereto.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
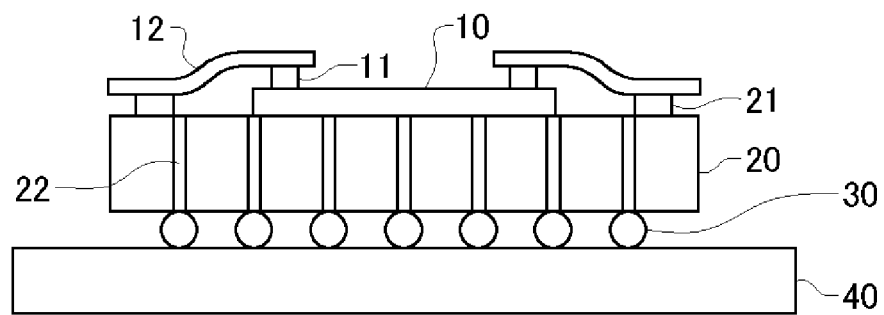
FIG. 1A shows a cross section of a first exemplary BGA package.

FIG. 1A shows a cross section of a first exemplary BGA package. In the first exemplary BGA package shown in FIG. 1A, the BGA package 100 includes a chip 10 on which a semiconductor integrated circuit is formed, a contact device 20 onto which the chip 10 is loaded, and a plurality of contacts 30 that are electrically connected to the semiconductor integrated circuit of the chip 10. The contacts 30 may be spherical ball contacts formed of a conductive material such as a solder.

The contacts 30 are arranged in a grid on a prescribed surface of the contact device 20. Arrangement in a grid may refer to arranging the contacts at prescribed intervals in two directions on a plane. In other words, the contacts 30 are arranged at points of intersection between first straight lines arranged in parallel at prescribed intervals and second straight lines arranged in parallel at prescribed intervals and having prescribed angles with respect to the first lines.

Pads 11 formed at the periphery of the semiconductor integrated circuit of the chip 10 and pads 21 formed on the contact device 20 may be electrically connected by bonding wires 12, for example. The pads 11 may be formed on the chip 10 along a periphery of a region formed by the semiconductor integrated circuit, and may be on the inside or the outside of this region. The pads 11 are electrically connected to the semiconductor integrated circuit of the chip 10.

The pads 21 may be connected to wiring formed on the surface of the contact device 20. This wiring is electrically connected to the contacts 30 through vias 22 formed in the contact device 20. As a result, the semiconductor integrated circuit of the chip 10 is electrically connected to the contacts 30 through the contact device 20. The chip 10 and the bonding wires 12 may be sealed using resin or the like.

Figure 1B:
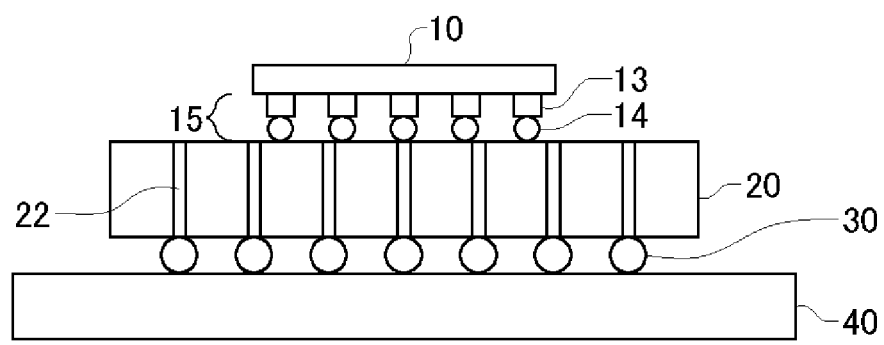
FIG. 1B shows a cross section of a second exemplary BGA package.

FIG. 1B shows a cross section of a second exemplary BGA package. In the second exemplary BGA package shown in FIG. 1B, the BGA package 100 includes a chip 10 on which is formed a semiconductor integrated circuit, a contact device 20 on which the chip 10 is loaded, and a plurality of contacts 30 that are arranged in a grid and are electrically connected to the semiconductor integrated circuit of the chip 10.

In this embodiment, pads 13 serving as electrodes may be formed on the bottom surface of the chip 10. Bumps 14 may be formed on the top surface of the contact device 20 at positions corresponding to the pads 13. The pads 13 are electrically connected to the bumps 14. The bumps 14 on the top surface of the contact device 20 are connected to signal wiring extending to the top surface of the contact device 20. The pads 13 are electrically connected to the contacts 30 through vias 22 formed in the contact device 20. As a result, the semiconductor integrated circuit of the chip 10 is electrically connected to the contacts 30 through the contact device 20.

In the present embodiment, the chip 10 and the contact device 20 have a flip chip connection, without using bonding wires to connect the chip 10 and the contact device 20. The chip 10 and the flip chip bonding section 15 may be sealed using resin or the like.

A BGA package 100 with the configuration shown in FIG. 1A or FIG. 1B may be loaded on a mounting substrate 40. The mounting substrate 40 may be a print wiring substrate, for example. The contact device 20 may have a ceramic substrate. The contacts 30 may be connected to the contact device 20 via metal-coated pads.

Figure 2A:
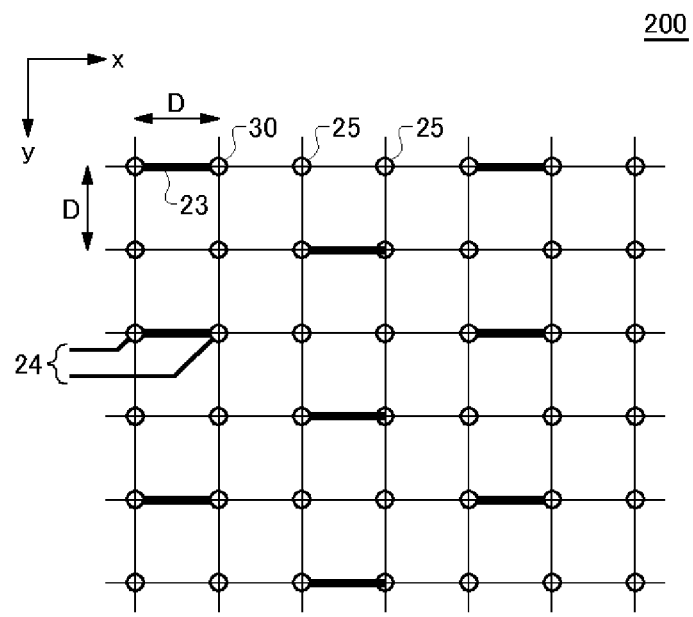
FIG. 2A shows a first exemplary signal terminal assignment of the contact array.
Figure 2B:
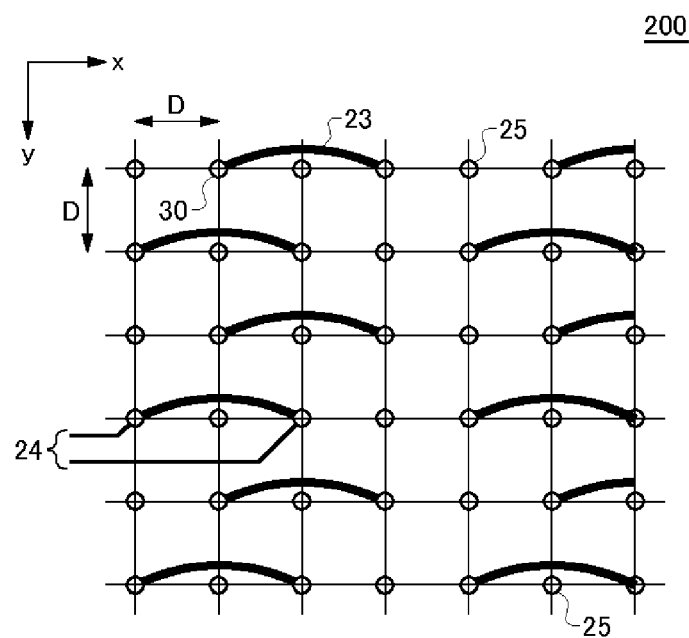
FIG. 2B shows a second exemplary signal terminal assignment of the contact array.

FIGS. 2A and 2B show exemplary contact arrays 200, having contacts 30 arranged in grids, and differential signal assignments. In FIGS. 2A and 2B, a pair of contacts 30 to which a differential signal is assigned, referred to hereinafter as a contact pair 23, are connected by a thick line. These thick lines do not indicate electrical wiring.

The thin lines in FIGS. 2A and 2B represent grid lines of the contact arrays 200, and do not indicate electrical wiring. Each set of two points forming a differential wire pair 24 is connected to a contact pair 23.

In FIGS. 2A and 2B, the contacts 30 are arranged at uniform intervals D in the x-axis direction and the y-axis direction. In the example of FIG. 2A, each contact pair 23 is arranged to be sandwiched by single contacts 25 in both the x-axis and y-axis directions. The single contacts 25 are supplied with a ground potential, a DC signal, or a low frequency signal whose frequency is lower than that of the differential signal, for example. By arranging the contact pairs 23 in this way, cross talk between the contact pairs 23 is reduced.

In the example of FIG. 2B, each contact pair 23 includes two contacts 30 arranged to sandwich a single contact 25 in the x-axis direction. Each contact pair 23 is arranged to sandwich one contact 30 in the x-axis direction, and the contact pairs 23 are arranged to be skewed from each other in the y direction by one contact 30 to the left or right. By arranging the contact pairs 23 in this way, the cross-talk between contact pairs 23 is reduced.

With the contact pair 23 arrangements shown in FIGS. 2A and 2B, the cross-talk can be decreased by more than if the contact pairs 23 are assigned in the contact array without providing single contacts 25. However, the number of contacts 30 used as single contacts 25 is increased, and this decreases the number of contact pairs 23 that can be arranged.

Figure 3:
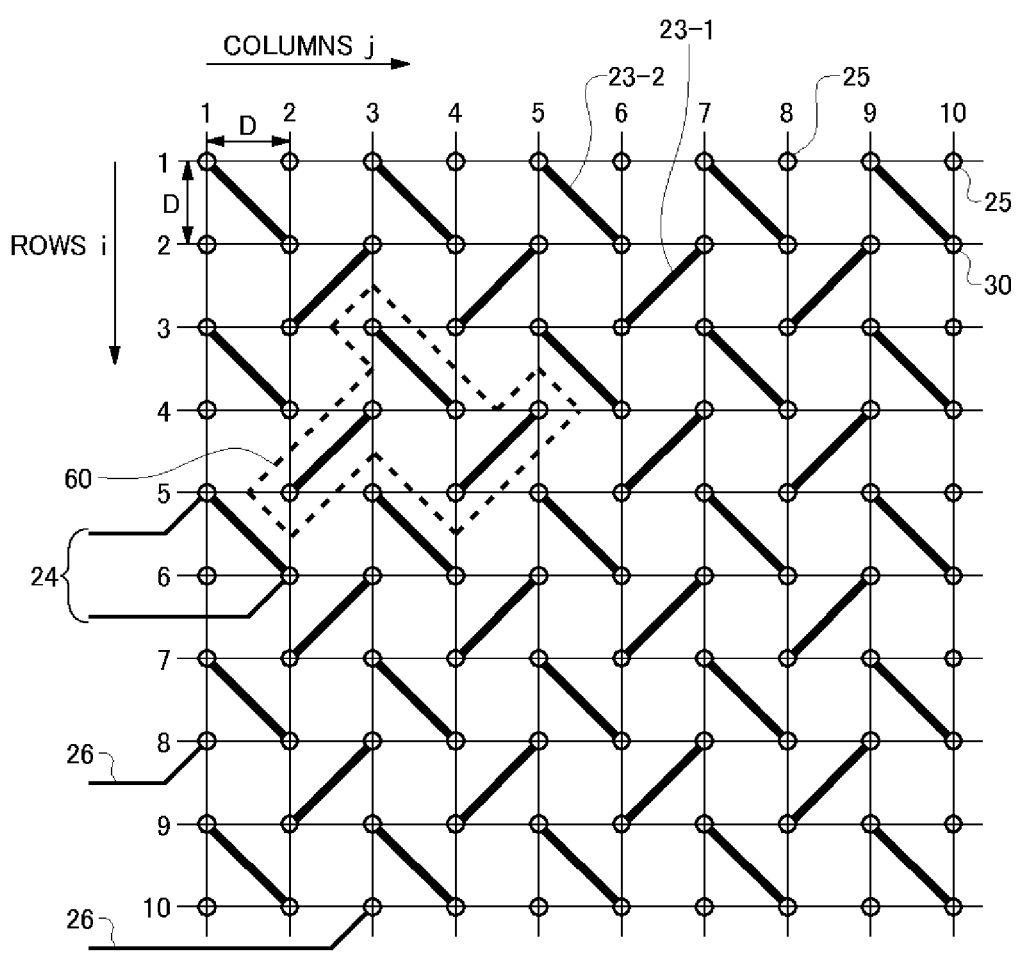
FIG. 3 shows a signal terminal assignment of the contact array according to a first embodiment.

FIG. 3 shows an exemplary contact device 20 according to a first embodiment. In the contact device 20, a contact array 200, in which contacts 30 are arranged in a grid, is electrically connected to a plurality of differential wire pairs 24.

The contact array 200 may be formed as a grid in which the contacts 30 are arranged at the points where grid lines intersect. For example, in the present embodiment, the contacts 30 are arranged in a grid at uniform intervals D in a row direction (i) and a column direction (j) orthogonal thereto, thereby forming the contact array 200.

In the present embodiment, each contact pair 23 may be formed of adjacent contacts 30. Here, "adjacent contacts 30" refers to contacts 30 that can be connected by a straight line forming a 45 degree angle relative to the column direction and the row direction, and having a distance therebetween of $2^{0.5} \times D$. The contact pairs 23 are electrically connected to differential wire pairs 24.

In FIG. 3, only one differential wire pair 24 is shown, but the differential wire pairs 24 are provided to correspond respectively to the contact pairs 23. In other words, each differential wire pair 24 is connected to one of the contact pairs 23 formed by two adjacent contacts 30 in the contact array 200.

In the present embodiment, the contact pairs 23 are arranged such that the direction of the straight line connecting the pair of contacts 30 in each contact pair 23 forms an angle of 45 degrees relative to both the row direction and the column direction. The positional coordinates of each contact 30 in the array is expressed as Bij. For example, the positional coordinates of the contact 30 in the first row and second column are B12. The positions of the contact pair 23 are expressed using the positional coordinates of two contacts 30, as (Bij, Bi'j').

For example, the contact pair (B52, B43) and the contact pair (B33, B44) are adjacent to each other. Here, "adjacent contact pairs 23" refers to contact pairs 23 in which one contact 30 in a first contact pair 23 is at a distance D from one contact 30 in a second contact pair 23. In other words, one of the contacts 30 in the contact pair (B33, B44) is a distance D from at least one of the contacts 30 in the contact pair (B52, B43), in this case the contact B43.

In the present embodiment, adjacent contact pairs 23 may be arranged such that the straight lines connecting the contacts 30 therein are oriented in different directions. In other words, each contact pair 23 may be arranged such that the direction of the straight line connecting the two contacts 30 therein is oriented in a different direction than the straight line connecting the two contacts 30 in each of the adjacent contact pairs 23. For example, the direction of the straight line connected the contacts 30 in the contact pair (B52, B43) is in a different direction than the straight line connecting the contacts 30 in the contact pair (B33, B44).

In the contact array 200, the contacts 30 are arranged in a grid at prescribed intervals D in a row direction (i) and a column direction (j) that are orthogonal to each other. The contact pairs 23 formed by two contacts 30 adjacent in a first arrangement direction forming an angle of 45 degrees relative to the row direction (i) and the column direction (j) are referred to as first contact pairs 23-1, and the contact pairs 23 formed by two contacts 30 adjacent in a second arrangement direction orthogonal to the first arrangement direction are referred to as second contact pairs 23-2. The first contact pairs and second contact pairs are arranged to alternate in both the first arrangement direction and the second arrangement direction.

In the present embodiment, the contact pair 23 (B52, B43) formed by the contacts B52 and B43 is oriented on a straight line forming an angle of 45 degrees relative to both the row direction and the column direction. The direction of this straight line is set as the first arrangement direction. The contact pairs 23 oriented in this direction are the first contact pairs 23-1.

Furthermore, the contact pair 23 (B33, B44) formed by the contacts B33 and B44 is oriented on a straight line forming an angle of 45 degrees relative to both the row direction and the column direction. The direction of this straight line is set as the second arrangement direction. The contact pairs 23 oriented in this direction are the second contact pairs 23-2.

The second arrangement direction is orthogonal to the first arrangement direction. In other words, the straight lines connecting the contacts 30 in the first contact pairs 23-1 are orthogonal to the straight lines connecting the contacts 30 in the second contact pairs 23-2.

The first contact pairs 23-1 and the second contact pairs 23-2 may be arranged to alternate in both the first arrangement direction and the second arrangement direction. For example, first contact pairs and second contact pairs adjacent in the first arrangement direction may be arranged in an alternating manner as shown by the contact pair 23-1 (B52, B43), the contact pair 23-2 (B33, B44), and the contact pair 23-1 (B34, B25). Similarly, first contact pairs and second contact pairs adjacent in the second arrangement direction may be arranged in an alternating manner as shown by the contact pair 23-2 (B33, B44), the contact pair 23-1 (B54, B45), and the contact pair 23-2 (B55, B66).

In the embodiment described below, the contact pairs are arranged such that the straight line extending from each first contact pair 23-1 passes through the centers 63 of the second contact pairs 23-2 adjacent thereto in the first arrangement direction, and the straight line 62 extending from each second contact pair 23-2 passes through the centers 65 of the first contact pairs 23-1 adjacent thereto in the second arrangement direction.

Figure 4:
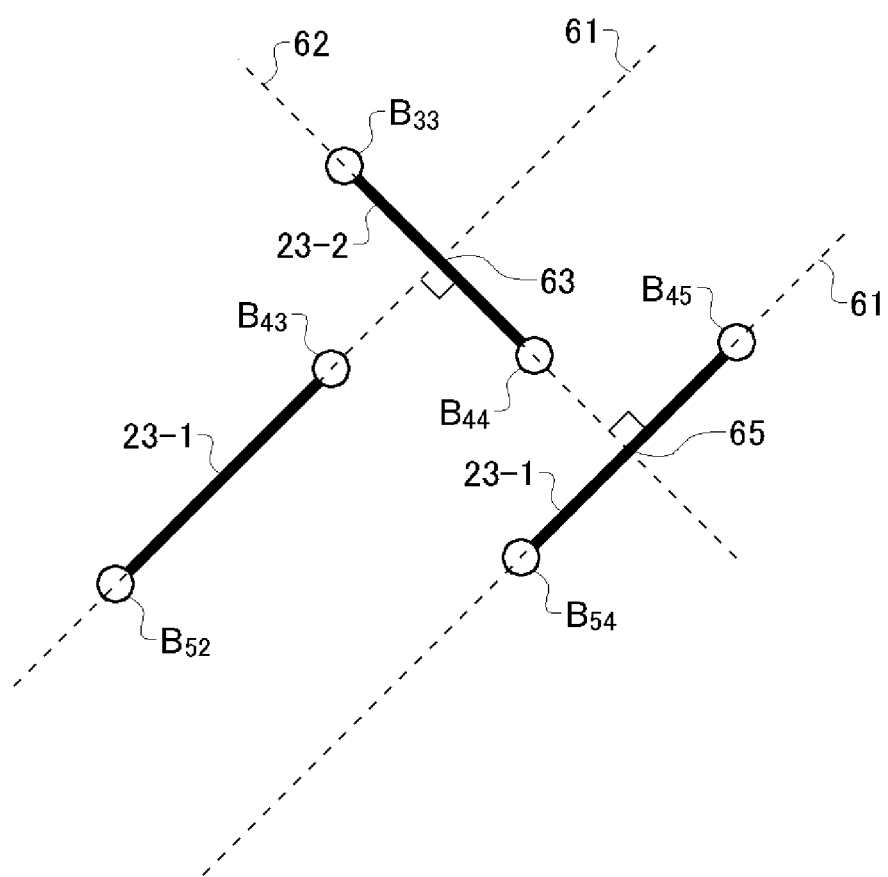
FIG. 4 is a magnified view of the contact array according to the first embodiment.

FIG. 4 is a magnified view of the region 60 of the contact array 200 shown in FIG. 3. The contacts 30 in the first contact pair 23-1 (B52, B43) are arranged on the straight line 61 extending through the contact pair 23-1 (B52, B43). In other words, the straight line extending through a contact pair refers to the straight line that connects the contacts 30 within the contact pair. The first contact pairs 23-1 may be the contact pair 23-1 (B52, B43) and the contact pair 23-1 (B54, B45).

The straight line 62 extends through the second contact pair 23-2. The second contact pair may be the second contact pair (B33, B44). Here, the straight lines 61 are orthogonal to the straight line 62. A straight line 61 passes through the center 63 of the second contact pair 23-2 (B33, B44) adjacent to the first contact pair 23-1 (B52, B43) in the first arrangement direction. The straight line 62 extending through the second contact pair 23-2 (B33, B44) passes through the center 65 of the first contact pair 23-1 (B54, B65) adjacent thereto in the second arrangement direction.

The following describes interference of contacts 30 in adjacent contact pairs 23. Here, "interference" includes interference exerted by the contacts 30 in a contact pair 23 on the contacts 30 in an adjacent contact pair 23 and interference exerted by at least one contact 30 in a contact pair 23 on an adjacent contact pair 23.

The following describes interference exerted by the two contacts B33 and B44 in the contact pair 23-2 (B33, B44) on the contact 43B in the adjacent contact pair 23-1 (B52, B43). As shown in FIGS. 3 and 4, the contact pairs 23 are arranged such that, for each contact pair 23, both contacts 30 therein are the same distance from at least one contact 30 in at least one adjacent contact pair 23.

For example, the contact B33 and the contact B44 are both a distance D from the contact B43. The transmission signals flowing through the contacts B33 and B44 of the contact pair 23-2 (B33, B44) have phases shifted by 180 degrees from each other.

Accordingly, the interference exerted by the contact B33 on the contact B43 has the same amplitude and the inverse phase of the interference exerted by the contact B44 on the contact B43. Since the two interferences cancel each other out in the contact B43, the contact B43 is less affected by interference from the adjacent contact pair (B33, B44).

The following describes the interference exerted on the contact pair 23-2 (B33, B44) by the contact B43. The interval between the contact B43 and each of the contacts B33 and B44 is the distance D, and therefore the contact B43 exerts the same interference on each of the contact B33 and the contact B44.

The transmission signal flowing through the contact pair 23-2 (B33, B44) is a differential signal, and therefore the interference exerted by the contact B43 on the contact B33 and the interference exerted by the contact B43 on the contact B44 cancel out. In other words, the interference exerted by the contact B43 on the contact pair 23-2 (B33, B44) adjacent thereto can be practically ignored.

The relationships described above occur between each contact 30 in a contact pair 23 of the contact array 200 and the contacts 30 in each adjacent contact pair 23. Accordingly, with the first embodiment, the interference exerted by contacts 30 in adjacent contact pairs on each other can be decreased, and the signal wiring can be arranged with high density.

The contact device 20 of the present embodiment may further include a single wire 26 for supplying a ground, supply power, or a single signal, and this single wire 26 is connected to a single contact 25 that is not part of a contact pair 23 and that is arranged on the outermost region of the grid in the contact array 200.

In a contact array 200 having a square periphery in which the number of contacts 30 in the row direction is the same as the number of contacts 30 in the column direction, as shown in FIG. 3, when the contact pairs 23 are arranged as described above, single contacts 25 that are not included in any contact pair 23 are formed at every other grid point on the outermost edge of the contact array 200. For example, contacts B21, B41, B61, B81, B101, B12, B14, B16, B18, and B110 are single contacts 25.

These single contacts 25 that are not included in any contact pair 23 may be assigned for use by a ground, a power supply, or a single signal. A single wire 26 for a ground, a power supply, or a single signal is connected to any of the single contacts 25. The contact device 20 of the present embodiment includes a plurality of single wires 26 connected to the single contacts 25 that are not included in any contact pair 23 and that are formed by every other contact 30 arranged on the outermost edges of the grid.

Figure 5:
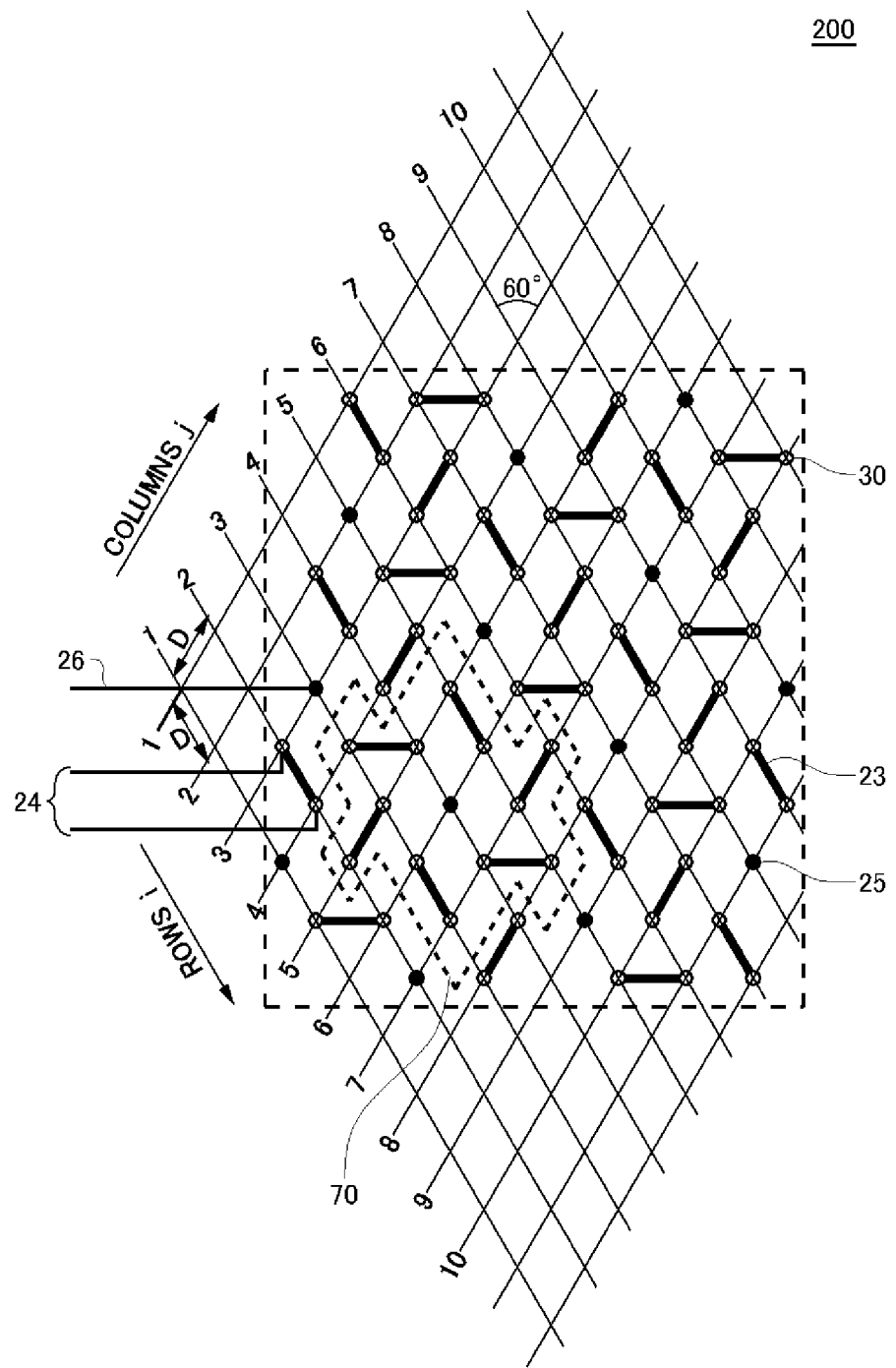
FIG. 5 shows a signal terminal assignment of the contact array according to a second embodiment.

FIG. 5 shows an exemplary contact device 20 according to a second embodiment. In the present embodiment, the contact array 200 is a grid with intersection points formed at prescribed intervals D in a row direction (i) and a column direction (j), which form an angle of 60 degrees with each other. In the same manner as the first embodiment, the thin lines in FIG. 5 indicate grid lines and the fat lines indicate contact pairs 23.

In the present embodiment, the single contacts 25 not included in any contact pairs 23 are uniformly distributed. The single contacts 25 are shown by black circles in FIG. 5. Here, "uniformly" means that the single contacts 25 are arranged to each have the same distance therebetween.

In this case, the single contacts 25 are arranged to form the vertices of right triangles. More specifically, each edge of each of these right triangles is $7^{0.5} \times D$. The differential wire pairs 24 are connected to the contact pairs 23, and single wires 26 are connected to the single contacts 25 shown by the black circles.

The six contacts 30 adjacent to each single contact 25 each form a contact pair 23 with another contact 30 that is not included in these six contacts 30. Furthermore, the contact pairs 23 are arranged such that the direction of six contact pairs 23 including the six contacts 30 adjacent to a single contact 25 each differ by 60 degrees.

Figure 6:
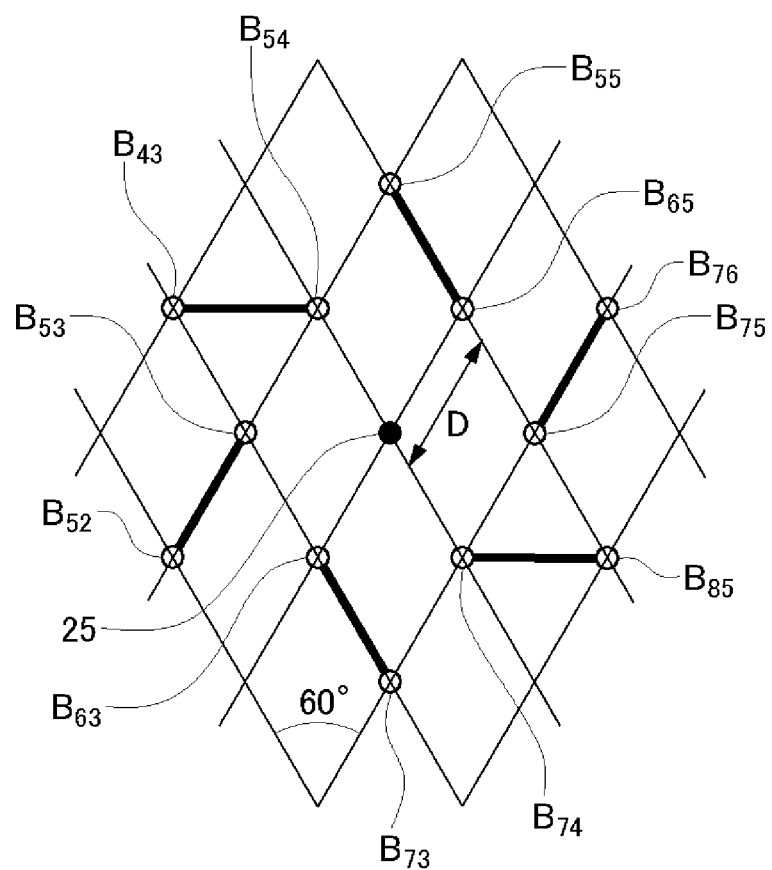
FIG. 6 shows a magnified view of the contact array according to the second embodiment.

FIG. 6 shows a magnified view of the region 70 in the contact array 200 of the present embodiment. The six contacts B53, B54, B65, B75, B74, and B63 are adjacent to the single contact 25. Here, "adjacent" means that the distance between the single contact 25 and each contact 30 is D.

The six contacts 30 adjacent to the single contact 25 form contact pairs 23 with the contacts 30 arranged further outward, as seen from the perspective of the single contact 25. For example, the contacts B53, B54, B65, B75, B74, and B63 respectively form the contact pairs (B53, B52), (B54, B43), (B65, B55), (B75, B76), (B74, B85), and (B63, B73).

The directions of the six contact pairs 23 formed by the six contacts 30 adjacent to the single contact 25 differ respectively by 60 degrees. For example, the orientation direction of the contact pairs (B53, B52), (B54, B43), (B65, B55), (B75, B76), (B74, B85), and (B63, B73) changes sequentially by 60 degrees in the stated order.

Each contact pair 23 is adjacent to other contact pairs 23 whose directions each differ from the that of the contact pair 23 by 60 degrees. Here, "adjacent contact pairs" are contact pairs having directions that differ by 60 degrees, and in which a contact 30 in one contact pair is a distance D from a contact 30 in the other contact pair. For example, the contact pair (B54, B43) is adjacent to the contact pair (B53, B52).

The six contacts 30 are arranged at the vertices of a hexagon centered on the corresponding single contact 25, and the direction of each respective contact pair 23 increases by 60 degrees each time the position relative to the corresponding single contact 25 rotates in a first direction.

The six contacts B53, B54, B65, B75, B74, and B63 adjacent to the single contact 25 may be arranged at the vertices of a hexagon centered on the single contact 25. The six contact pairs 23 including the six contacts 30 adjacent to the single contact 25 have respective vector directions that sequentially increase by 60 degrees for each clockwise rotation. The vector direction of each contact pair 23 is defined as the direction from the contact 30 adjacent to the single contact 25 to the other contact 30 in the contact pair 23.

For example, the contact pair (B54, B43) is rotated 60 degrees clockwise relative to the contact pair (B53, B52). The contact pairs (B53, B52), (B54, B43), (B65, B55), (B75, B76), (B74, B85), and (B63, B73) are arranged in a manner to be sequentially rotated 60 degrees clockwise around the single contact 25.

FIG. 5 is used to describe the positional relationship between contact pairs 23 and the single contact 25 adjacent thereto. The two contacts 30 in each contact pair 23 are each adjacent to a different single contact 25.

For example, the contacts B53 and B52 in the contact pair (B53, B52) are respectively adjacent to the single contact 25 (B64) and the single contact 25 (B41).

Each single contact 25 may be connected to a single wire 26 for providing a ground, supplying power, or providing a single signal. Instead, a single contact 25 may serve as a barrier to suppress interference between contact pairs uniformly arranged in the contact array 200.

In the present embodiment, the interference can be decreased between contacts 30 of adjacent contact pairs 23 in a contact array 200 where contacts 30 are arranged in a row direction and a column direction intersecting at an angle of 60 degrees, and therefore the contact pairs 23 can be arranged with high density. In other words, for adjacent contact pairs 23, the same distance can be achieved between each of the two contacts 30 in one of the contact pairs 23 and one of the contacts 30 in the other contact pair 23, as shown in FIG. 6.

In the above embodiments, the differential wire pairs 24 are connected to the contact pairs 23, but not all contact pairs 23 need to be connected to differential wire pairs 24. For example, the contacts 30 in some of the contact pairs 23 arranged in the contact array 200 may be connected to single wires for providing a ground, supplying power, or providing a single signal.

The contact array of the above embodiments was described using a BGA as an example, but pin assignments of bumps on the substrate side when implementing the flip chip can also be configured using the above array configuration. Furthermore, assignments for electrode pins using connections between layered chips, such as TSV, can be configured using the above array configuration.

In the above embodiments, other types of contacts may be used as the contacts 30. For example, instead of an array of contacts 30, a connector including a plurality of contacts may be used.

As shown in FIG. 5, each single contact 25 is positioned between six contacts 30 arranged in the row direction and column direction. Each contact 30 at a distance D from in the row direction a single contact 25 forms a contact pair 23 with the contact 30 at a distance D from itself in a direction forming an angle of 60 degrees with the column direction.

Furthermore, each contact 30 at a distance 2D in the row direction from a single contact 25 forms a contact pair 23 with the contact 30 that is a distance D from itself at an angle of 180 degrees. Each contact 30 at a distance 3D in the row direction from a single contact 25 forms a contact pair 23 with the contact 30 that is a distance D from itself at an angle of 120 degrees.

Each contact 30 at a distance 4D in the row direction from a single contact 25 forms a contact pair 23 with the contact 30 that is a distance D from itself at an angle of 300 degrees. In other words, each contact 30 at a distance 3D in the row direction from a single contact 25 forms a contact pair 23 with the contact 30 that is a distance 4D from the single contact 25.

Each contact 30 at a distance 5D in the row direction from a single contact 25 forms a contact pair 23 with the contact 30 that is a distance D from itself at an angle of 0 degrees. Each contact 30 at a distance 6D in the row direction from a single contact 25 forms a contact pair 23 with the contact 30 that is a distance D from itself at an angle of 240 degrees.

Sets of a single contact 25 and six contacts 30 described above are arranged repeating in the column direction. The single contacts 25 arranged in a column are arranged such that an increase in position of D in the column direction corresponds to an increase of 3D in the row direction. With this arrangement, the directions of the six contact pairs 23 arranged around each single contact 25 sequentially differ from each other by 60 degrees, as shown in FIG. 6.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A contact device comprising:
a contact array, in which contacts are arranged in a grid in which the contacts are ositioned at uniform intervals in a row direction and a column direction the contacts including a plurality of contact pairs each of which is formed by two adjacent contacts in the contact array and arranged such that a direction of a straight line connecting the two contacts of the contact pair is different from a direction of a straight line connecting the two contacts of an adjacent contact pair; and
a plurality of differential wire pairs electrically connected to the contact array such that each differential wire pair is connected to one of the plurality of contact pairs.

2. The contact device according to claim 1, wherein
the contact pairs are each arranged such that the two contacts therein are each the same distance from at least one contact in at least one contact pair adjacent thereto.

3. The contact device according, to claim 2, wherein
the row direction and the column direction are orthogonal to each other,
each contact pair formed by two contacts adjacent to each other in a first arrangement direction, which is a direction forming an angle of 45 degrees relative to both the row direction and the column direction, is a first contact pair,
each contact pair formed by two contacts adjacent to each other in a second arrangement direction, which is a direction orthogonal to the first arrangement direction, is a second contact pair, and
the first contact pairs and the second contact pairs are arranged to alternate in both the first arrangement direction and the second arrangement direction.

4. The contact device according to claim 3, wherein
the contact pairs are arranged such that each straight line extending from a first contact pair passes through centers of the second contact pairs adjacent thereto in the first arrangement direction, and each straight line extending from a second contact pair passes through centers of the first contact pairs adjacent thereto in the second arrangement direction.

5. The contact device according to claim 4, further comprising a single wire that is arranged on an outermost edge of the grid of the contact array, connected to a contact not included in any contact pair, and used for providing to ground, supplying power, or providing a single signal.

6. The contact device according to claim 5, wherein
a plurality of the single wires are connected to contacts, corresponding to every other contact arranged on the outermost edges of the grid, that are not included in any contact pair.

7. The contact device according to claim 2, further comprising single wires connected to single contacts distributed uniformly among the contacts of the contact array, wherein
the contact array is a grid in which the contacts are arranged at prescribed intervals in a row direction and a column direction, which form an angle of 60 degrees with each other, and
the contact pairs are arranged such that each of six contacts adjacent to a single contact forms a contact pair with another contact not among the six adjacent contacts, and directions of the six contact pairs including the six contacts adjacent to the single contact sequentially differ by 60 degrees.

8. The contact device according to claim 7, wherein
the six contacts in each set are arranged at vertices of a hexagon centered on the corresponding single contact, and the directions of the corresponding six contact pairs increase sequentially by 60 degrees when the position relative to the single contact rotates in a first direction.

9. The contact device according to claim 8, wherein
the two contacts in each contact pair are each adjacent to a different single contact.

10. The contact device according to claim 1, wherein
the contact array is a BGA.

11. A circuit package comprising:
a contact device including a contact array that has contacts arranged in a grid in which the contacts are positioned at uniform intervals in a row direction and a column direction, the contacts including a plurality of contact pairs each of which is formed by two adjacent contacts in the contact array and arranged such that a direction of a straight line connecting the two contacts of the contact pair is different from a direction of a straight line connecting the two contacts of an adjacent contact pair; and
a semiconductor substrate on which a circuit is formed, the circuit electrically connected to the contact device, the semiconductor substrate including a plurality of differential electrode pairs that receive and transfer differential signals, each differential electrode pair connected to one of the plurality of contact pairs.

* * * * *